United States Patent

[11] 3,621,450

[72] Inventors Lloyd R. Blair;
Gregory L. Martin, both of Phoenix, Ariz.

[21] Appl. No. 884,927
[22] Filed Dec. 15, 1969
[45] Patented Nov. 16, 1971
[73] Assignee Goodyear Aerospace Corporation
Arkon, Ohio

[54] LINEAR SWEEP FREQUENCY GENERATOR WITH SAMPLING CIRCUIT PHASE CONTROL LOOP

5 Claims, 4 Drawing Figs.

[52] U.S. Cl. .......... 331/10, 328/151, 328/155, 331/14, 331/22, 331/25, 331/178
[51] Int. Cl. .......... H03b 3/04, H03b 23/00
[50] Field of Search .......... 331/1 A, 4, 10, 11, 12, 14, 18, 22, 23, 25, 178; 328/151, 155; 325/131; 343/17.2 R, 17.5

[56] References Cited

UNITED STATES PATENTS

| | | | |
|---|---|---|---|
| 3,221,266 | 11/1965 | Vitkovits, Jr. | 331/4 X |
| 3,382,460 | 5/1968 | Blitz et al. | 331/4 X |

*Primary Examiner*—Roy Lake
*Assistant Examiner*—Siegried H. Grimm
*Attorney*—J. G. Pere

ABSTRACT: The invention includes means to generate a substantially linear FM waveform pulse. A phase comparison of the FM waveform pulse is made with respect to several reference constant frequency waveform signals whose frequencies and phase are made to match an ideal FM waveform pulse at preselected points during the pulse. The frequencies of the reference signals are chosen to be multiples of a reference oscillator. The frequency of the oscillator is chosen to give the desired number of correction points during the pulse. The FM waveform pulse and the reference signals are mixed in separate mixers and the output of each mixer is sampled at a predetermined time by a gate. The outputs of the gates are then integrated and used to correct the FM waveform pulse over the time interval just prior to the sample time. This system will reach a stable equilibrium when the phase of the reference signals and the FM waveform pulse are in phase quadrature since the output of all the mixers are zero for this condition. When a sufficient number of samples are taken, the FM waveform pulse at equilibrium is a highly linear signal.

INVENTORS
LLOYD R. BLAIR
GREGORY L. MARTIN
BY
Oldham & Oldham
ATTORNEYS

INVENTORS
LLOYD R. BLAIR
GREGORY L. MARTIN
BY:
Oldham & Oldham
ATTORNEYS

LINEAR SWEEP FREQUENCY GENERATOR WITH SAMPLING CIRCUIT PHASE CONTROL LOOP

Many radar designs require that a linear frequency modulated waveform be transmitted. In some cases the requirement arises because of peak power limitations in the transmitter. In other cases it is desired to use FM radar techniques for range discrimination of targets, or similarly it may be desirable to use the "stretch" technique to provide a reduction in bandwidth of the video signal. In most cases it is desirable to keep the phase errors in the transmitted signal as small as possible so that range resolution is not degraded.

The primary purpose of the invention is to provide a technique for generating an FM pulse with a dispersion factor as large as $10^5$ or more.

For a better understanding of the invention reference should be made to the accompanying drawings wherein FIG. 1 represents a plurality of graphs indicating frequency versus time plot of various radar signals;

To establish a need for such a dispersed pulse one may assume that it is desired to transmit a wide band radar pulse to obtain fine range resolution and still be able to record the return video signal using existing relatively narrow band recorders. Such requirement can be met by transmitting a linear FM signal and mixing the return signal with one or more signals whose FM rate is the same as the transmitted pulse. This operation may be recognized as the well-known FM radar method of obtaining range resolution.

Figures 1, 2:
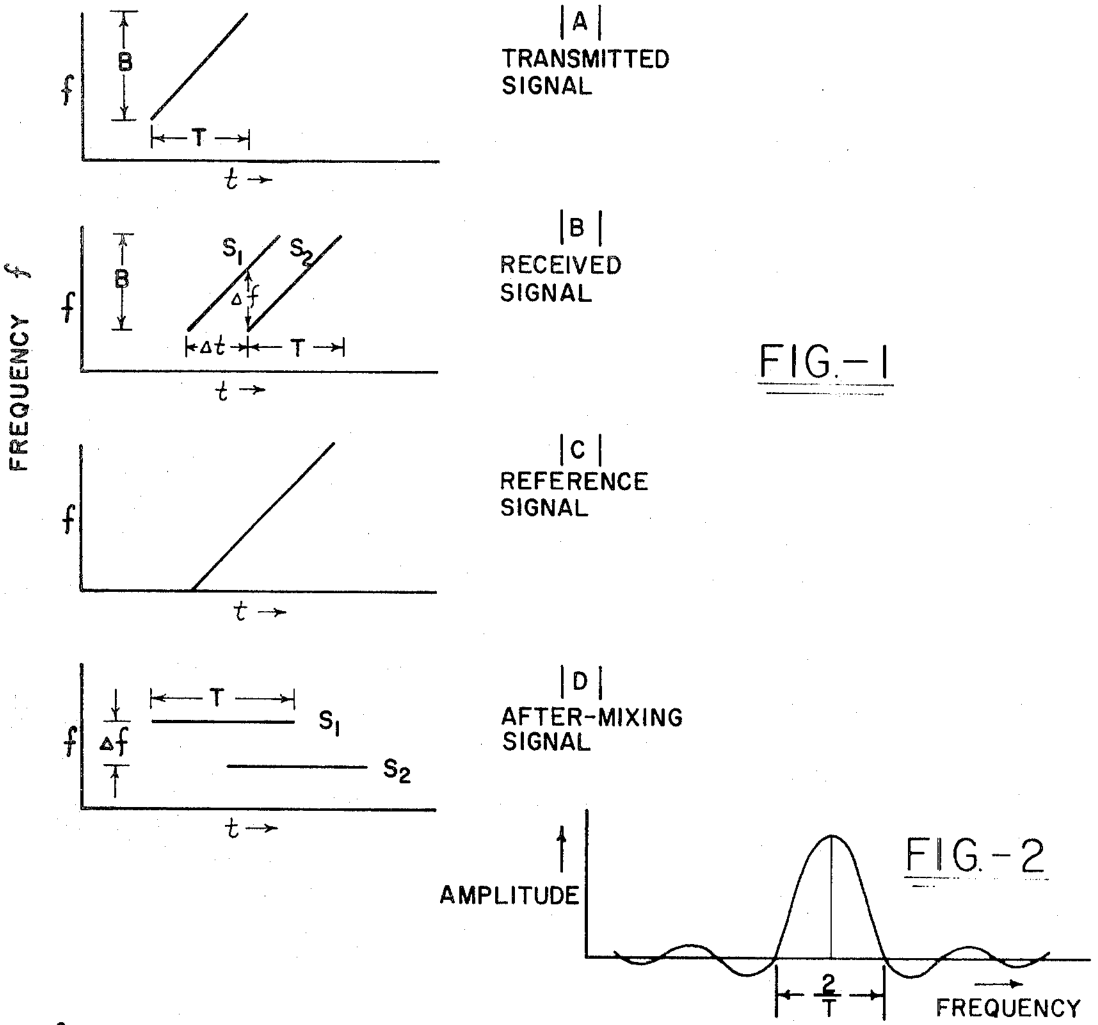
FIG. 2 is a graphic illustration of the spectrum of a target after mixing.

A relationship between various parameters of such a FM system may be obtained by referring to FIG. 1. In FIG. 1, the transmitted signal is a linear FM signal which is swept through a frequency band B, in a time period T, as shown in Graph A. The return signal characteristics are $S_1$ and $S_2$ as shown in Graph B, where the targets consist of two point reflectors separated by a slant range interval which corresponds to a time differential $\Delta t$. The reference signal which is shown in Graph C has the same FM rate as the signals in Graphs A and B. After mixing, signals $S_1$ and $S_2$ are converted to two constant frequency signals separated by a frequency interval $\Delta f$, as shown in Graph D.

From the geometry of Graph B, it is apparent that:

$$B/T=\Delta f/\Delta t \qquad (1)$$

To determine system resolution reference should be made to FIG. 2, where the spectrum of a target signal after mixing is plotted. Two targets will be near the point of limiting resolution if they are separated by a frequency interval:

$$\Delta f_{limit}=1/T \qquad (2)$$

Thus, it is seen that the limiting time resolution as obtained from equations 1 and 2 above is $$\Delta t_{limiting}=1/B \qquad (3)$$

which as may be expected, is in agreement with what would be expected of a radar with a bandwidth B.

The range interval which can be recorded in a single channel of the recorder is limited by the bandwidth of the recorder $f_r$. Thus letting $\Delta f=f_r$, we find that a slant range swath width per channel of $$\Delta t_r=Tf_r/B \qquad (4)$$

is obtained.

To obtain the greatest possible recording interval per channel, it is necessary to transmit as long a pulse as other constraints will allow. The number of recording channels which must be operating simultaneously is $$M=T_s\Delta t_r=T_sB/\,Tf_r \qquad (5)$$

where $T_s$ is the swath time interval which is set by the swath width.

This expression is valid for $T_s<T$.

Since $T_s$, B, and $f_r$ are determined by system and component specifications, the invention contemplates that T must be made very large to minimize the number of channels. Thus, assuming range resolution requirements of 2 feet then $B=500$ Mc. If the radar pulse repetition frequency and swath width allow the transmitted pulse to be 50 microseconds long it is necessary to obtain a dispersion factor of $$D=BT=2.5\times10^4 \qquad (6)$$

GENERATION OF THE DISPERSED PULSE

It is an important feature of the invention to generate the highly dispersed pulse with phase errors no greater than plus or minus $\pi/2$ radians in order to effectively utilize the bandwidth when the pulse is compressed. The invention contemplates that a phase-corrected chirp utilizing a phase control system which is easy to instrument for wide band chirp waveforms will be utilized. A phase comparison of the FM waveform is made with respect to several constant frequency waveforms whose frequencies and phase are made to match an ideal FM waveform at preselected points during the pulse.

Figure 3:
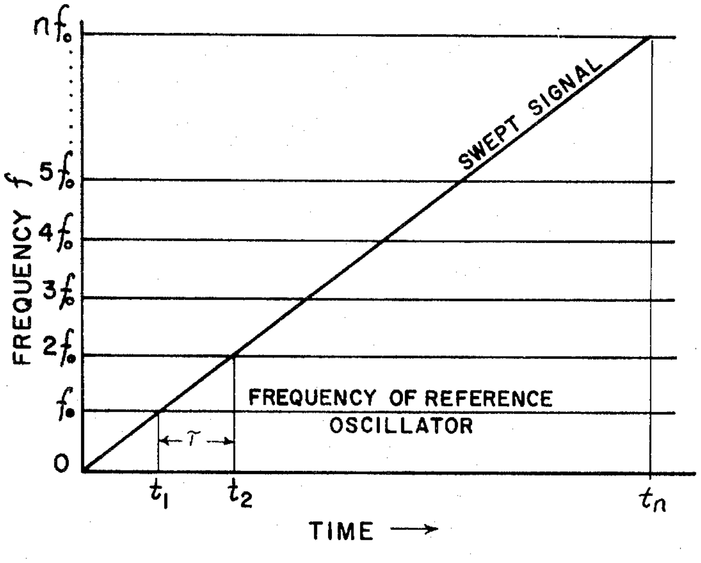
FIG. 3 is a graph indicating the signals used in phase correcting a chirp generator.

The frequencies of the reference signals are chosen to be multiples of a single oscillator as shown by the Graph of Fig. 3. The frequency of the oscillator is chosen to give the desired number of correction points during the pulse. Certain conditions must be satisfied so that the phase of the reference signals is the desired value at the time that the frequency of the swept signal matches the frequency of the reference. Specifically, let the phase of the swept signal be $$\Phi=\pi ft^2 \qquad (7)$$

where $f$ is the FM rate of the signal.

The phase of the reference is $$\theta=2\pi f_o t \qquad (8)$$

where $f_o$ is the frequency of the reference. To ensure that the swept signal changes frequency by an amount $f_o$ between sample times let $$f\tau=f_o \qquad (9)$$

The time interval between samples is $\tau$. Therefore, the harmonics of $f_o$ will match the FM signal frequency at the sample points $$t=t_n=n\tau \qquad (10)$$

Let $$\tau=d/f_o \qquad (11)$$

where $d$ is an integer so that references traverse an integral number of cycles between samples. Therefore, from equations (9) and (11) the required reference frequency $$f_o=\sqrt{df} \qquad (12)$$

is obtained. Equation (11) may be written as $$d=f_o\tau \qquad (13)$$

Therefore, $d$ is actually the dispersion factor for the FM pulse segment whose bandwidth is $f_o$ and whose dispersed length is $\tau$.

The above conditions relating the various parameters may be used to ensure that the phase of the swept signal is an integral multiple of $2\pi$at the sample points. From equations (7) and (10) it is found that $$\theta_n=\pi fn^2\tau^2 \qquad (14)$$

Upon substitution of the value for $\tau$ from equation (11), we have $$\theta_n=(fn^2d^2/f_o^2) \qquad (15)$$

Upon combining equations (12) and (15) further we have $$\theta_n=\pi n^2 d \qquad (16)$$

Therefore, by requiring that $d$ be an even integer, such as 32, $\theta_n$ is a multiple of $2\pi$ as desired.

Figure 4:
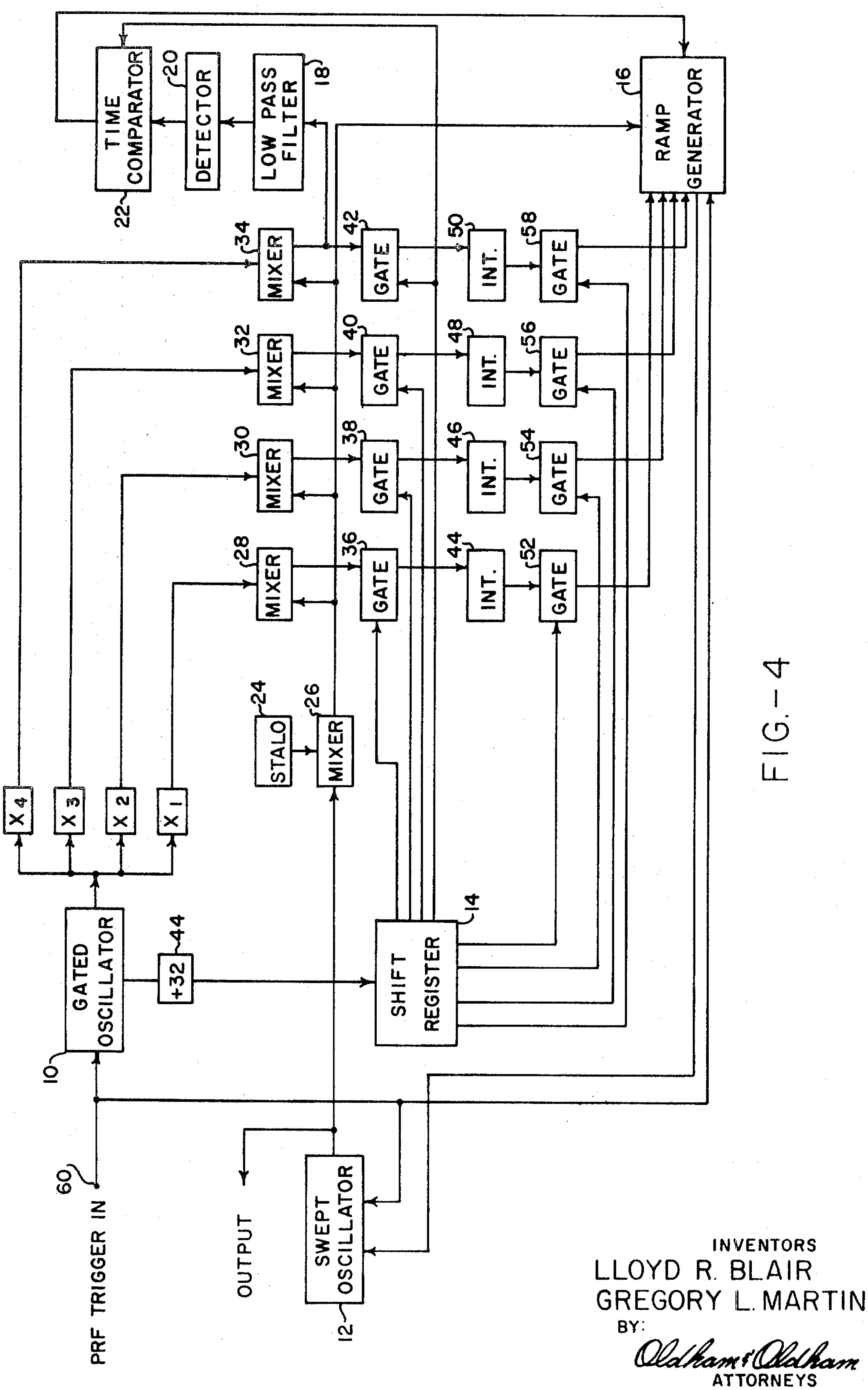
FIG. 4 is a schematic block diagram of a phase-corrected chirp system.

A block diagram of a mechanization of the phase-correcting system is shown in FIG. 4. The actual structural components illustrated in FIG. 4 comprise a gated oscillator 10, a swept oscillator 12, a shift register 14, a ramp generator 16, a low-pass filter 18, a detector 20, and a time comparator 22. It may be noted that the swept oscillator 12 operates in the microwave region and its signal is mixed with a stalo 24 in mixer 26 to obtain the waveform described by equation (7).

The swept signal and the references after passing through multiplier $X_1$ through $X_4$ are mixed in appropriate mixers 28 through 34 and the output of each mixer is sampled at the proper time by a respective gate 36 through 42. The gates 36 through 42 are activated by a ring counter in the shift register 14 which is in turn triggered at a rate $f_o/32$ by the divide by 32 signal 44 as actuated by oscillator 10.

The outputs of the gates 36 through 42 are then passed to respective integrators 44 through 50 and used to correct this sweep rate over the time interval just prior to the sample time. This is accomplished by the outputs of the integrators passing to respective gates 52 through 58 with the gates being appropriately controlled by a signal from shift register 14 and the gate outputs being sent to ramp generator 16. The system will reach a stable equilibrium when the phase of the reference and the swept signal are in phase quadrature since the output of the mixer 26 is zero for this condition. When a sufficient number of samples are taken, the swept signal at equilibrium is a highly linear FM ramp.

The width of the sample gates $36_1$ through $42_4$ are selected so that the phase shift in the signal after mixing does not change by more than 45° during the sample time. The phase of the error signal near the zero beat time $t_n$ is $$\theta_z=\pi\dot f(t-t_n)^2 \qquad (17)$$

Where $\theta_z=\pi/4$, this results in $$t-t_n=\pm\frac{1}{\sqrt[2]{\dot f}} \qquad (18)$$

For the case $B$=500 Mc and $T$=50 $\mu$sec. and $\dot f$=10 Mc/$\mu$second, $t-t_n=\pm0.176$ $\mu$sec. or the sample time can be 0.35 $\mu$sec. in duration.

The number of samples which must be made depends upon the accuracy of the uncorrected waveform. Naturally, this accuracy depends on the characteristics of the swept oscillator 12. The primary error in matching the swept waveform to the desired waveform is due to an incorrect FM rate. The number of samples is critical and is chosen so that the phase error of the uncorrected input signal waveform does not exceed 90° with respect to an ideal FM waveform between samples. If the phase error of $\pi/2$ radians is accumulated over a time interval then the allowable error in the FM rate is $$\Delta\dot f=1/(2\tau)^2 \qquad (19)$$

This equation is derived by differentiating equation (17) with respect to $\dot f$ and letting $d\theta_z=\pi/2$ and $(t-t_n)=\tau$.

The dispersion over a time interval $\tau$ and corresponding frequency interval $f_o$ is $$d=f_0\tau=\dot f\tau^2 \qquad (20)$$

By combining equations (19) and (20), the allowable fractional error in the FM rate is found to yield $$\Delta\frac{\dot f}{\dot f}=\frac{1}{2d} \qquad (21)$$

The fractional error may be readily held to 1.5 percent and therefore a dispersion of 32 may be attained with phase error no greater than $\pi/2$. Taking $d$=32 and $\dot f=10^{13}$ Mc/$\mu$sec. we find that $\tau=1.79\mu$sec. Thus, a correction would be made every 1.79 $\mu$seconds, approximately.

Therefore 28 correction points are required during the 50 $\mu$second pulse for the above assumptions. The frequency of the fundamental reference oscillator is thus found from the equation $$f_0=\dot f\tau \qquad (22)$$

to be 17.9 Mc.

LOCK-ON AND ERROR CHECK SYSTEM

The output signals from one or more of the mixers can be used in a manner which will unambiguously sense frequency errors in the FM waveform. This feature can be used as an aid during lock-on or as a test feature to detect a malfunction and thereupon initiate a new lock-on.

As shown in FIG. 4, the output of a mixer, such as mixer 34, may be passed through the low-pass filter 18 and by detecting the output in detector 20, the zero beat-time can be determined. This time can be compared to the desired zero beat-time in comparator 22 with this, thus providing an error signal to control the ramp slope in generator 16 before the phase correction circuits are activated, this all being appropriately controlled by shift register 14.

If a simple low-pass filter of optimum time constant is used the detected pulse width is approximately $$T_1=\sqrt{\frac{2}{\dot f}} \qquad (23)$$

If a pulse compression network is used over one intersample period $\tau$, then the detected pulse width is approximately $$\Delta T_2=1/\dot f\tau \qquad (24)$$

Taking the case $\dot f$=10 Mc/$\mu$sec., and $\tau$=1.79 $\mu$sec., we have $\Delta T_1=5\times10^{-7}$sec. approximately and $\Delta T_2=5\times10^{-8}$ sec. approximately.

The entire pulse is assumed to be 50 $\mu$sec. in duration which therefore means the technique described above provides a timing accuracy to 0.1 percent.

In practice, the timing accuracy can be improved beyond the above values by a factor of 10 or so since the leading edge of the pulse may be used as a timing reference. The detection system would be made independent of phase by the use of in-phase and quadrature channels.

The lock-on process consists of a sequence of several events. First, the swept oscillator 12 is phase-locked to the microwave stalo 24 just prior to each trigger pulse 60. The phase-locking is accomplished by controlling the base line level of the ramp from the generator 16. The phase lock loop is disabled during the sweeping period.

The FM rate is now set to within 1 percent or so of the desired value by use of the zero beat-time comparator 22. After a few pulse periods the first phase error integrator 44 is activated and its output is used to correct the ramp slope in generator 16 so that the phase of the swept signal is correct at time $t_1$. The second phase error integrator 54 is activated after number 52 has reached equilibrium. This integrator corrects the ramp slope after time $t_1$.

Also, the zero beat-time comparator 22 is operated on an open loop basis after the first phase error integrator 44 takes control. The curvature of the uncorrected $f$ vs. $t$ plot of the swept oscillator 12 must be sufficiently small so that the change in the average FM rate over adjacent time intervals does not exceed the tolerance indicated by the equation $$\frac{\Delta\dot f}{\dot f}=\frac{1}{2d} \qquad (21)$$

The remaining integrators 48 and 50 or however many are in the system are activated in sequence with the $n^{th}$ integrator correcting the ramp slope after the time $t_{n-1}$.

Hence it can be seen that the objects of the invention have been achieved by providing a phase correction system which is easy to instrument for wide-band chirp waveforms. The constant frequency waveforms are made to match an ideal FM waveform at preselected points during the pulse. Frequencies of the reference signals are chosen to be multiples of a reference oscillator. Frequency of the oscillator is chosen to give the desired number of correction points during the pulse.

While in accordance with the Patent Statutes only the best known embodiment of the invention has been illustrated and described in detail, it is to be particularly understood that the invention is not limited thereto or thereby, but that various modifications may be made to still fall within the purposes of the invention.

What is claimed is:

1. Apparatus to generate a precision linear frequency modulated signal which comprises means to generate an approximately linear frequency modulated signal as an input signal waveform, means to generate several constant-frequency waveforms whose frequency and phase are made to match a pulse of an ideal frequency modulated waveform at preselected points during the pulse, said means comprising a gates oscillator, and input trigger actuating the oscillator, and frequency multipliers driven by the oscillator, means to phase-compare the input signal waveform with respect to the constant-frequency waveforms at predetermined spaced intervals to produce error signals, which means comprises means to selectively mix the input signals waveform with each respective constant-frequency waveform gate means to sample each mixed signal at a predetermined time, shift register means actuated by the gated oscillator actuating the sampling by the gate means, means to integrate the gated signals and gate the integrator outputs to produce the error signals, such shift register means further sequentially sending the error signals of last said gate means to correct the means to generate an approximately linear frequency modulated signal as an input signal waveform.

2. Apparatus according to claim 1 where the predetermined widths for gating of the mixer output signals are chosen so that the phase shift does not change by more than 45° during the sample time.

3. Apparatus according to claim 1 which includes a low-pass filter receiving the output of one of the means to mix the input signal waveform and the appropriate constant frequency waveform, means to detect the zero beat-time of such mixed signal, means to compare such detected zero beat-time to a desired zero beat-time indicated by the shift register and generate an error signal, and means to control the ramp slope in the generator by such error signal before the outputs of last said gate means are sent to the generator.

4. Apparatus according to claim 3 where the low-pass filter receives the output of the means to mix receiving the highest frequency constant frequency.

5. Apparatus according to claim 1 where the means to generate the approximate linear frequency modulated signal is a swept oscillator operating in the microwave region, a ramp generator driving the swept oscillator, a stalo, and a mixer combining the signal from the swept oscillator and the stalo.

* * * * *